March 6, 1951 J. E. WILLIAMS 2,543,819
PUSH-PULL-DIFFERENTIAL ELECTRONIC AMPLIFIER
Filed May 14, 1948
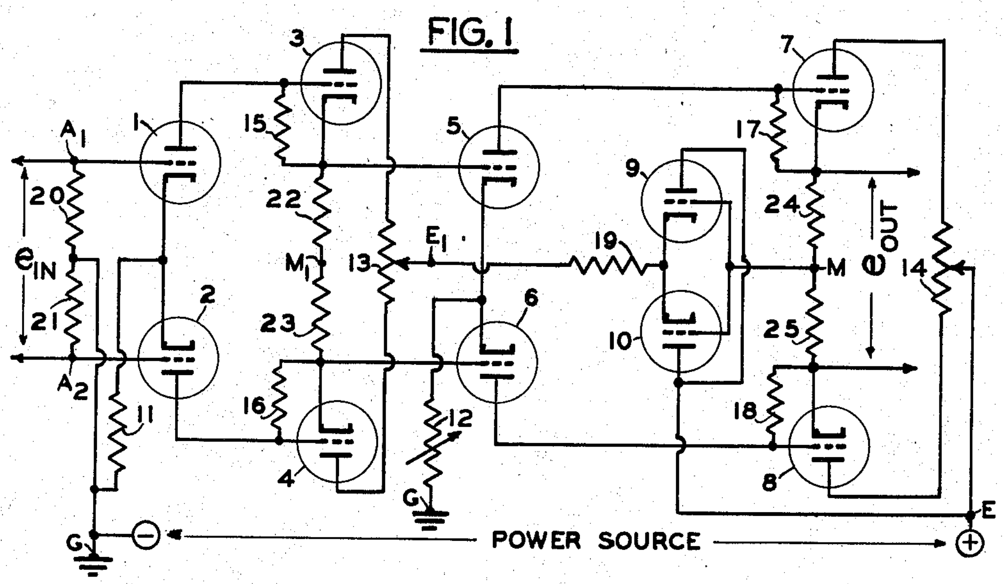
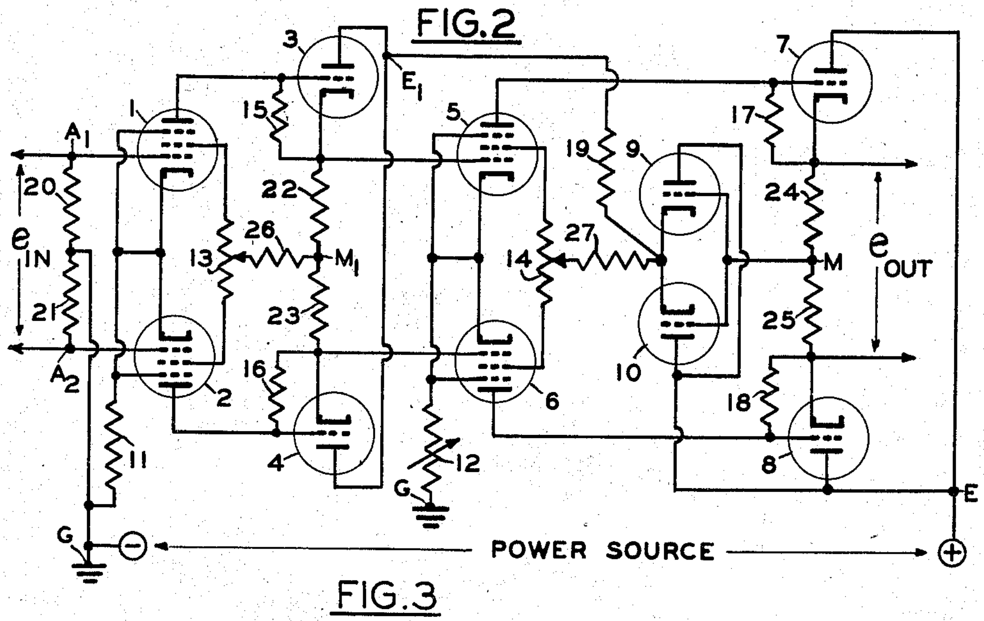
FIG. 3
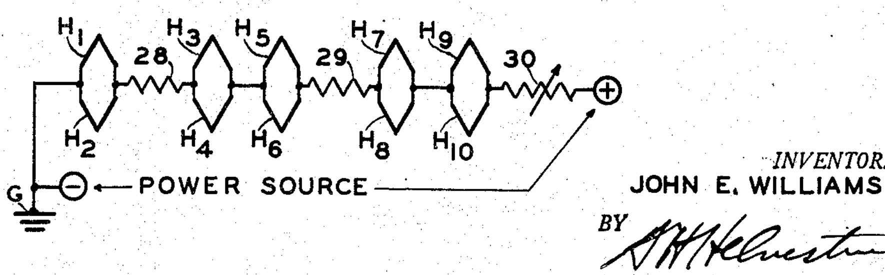
*INVENTOR.*
JOHN E. WILLIAMS
*BY* [signature]
*ATTORNEY*

Patented Mar. 6, 1951 2,543,819

UNITED STATES PATENT OFFICE 2,543,819

PUSH-PULL DIFFERENTIAL ELECTRONIC AMPLIFIER

John E. Williams, Atlantic City, N. J.

Application May 14, 1948, Serial No. 27,098

9 Claims. (Cl. 179—171)

(Granted under the act of March 3, 1883, as amended April 30, 1928; 370 O. G. 757)

This invention relates to a broad-band push-pull-differential electronic amplifier.

The present invention also relates, in part, to my prior application, Serial No. 653,694, filed March 11, 1946, which disclosed means for conversion of single-sided excitation to push-pull amplification in a cascaded differential electronic amplifier.

One object of my invention is to provide means, in a basic stage of push-pull-differential electronic amplification, capable of effecting stable, linear, high-gain amplification of variable voltages or currents, over a broad band of frequencies including zero cycles per second, at low noise level, inherently adapted to half-wave (single-sided) or to full-wave excitation, and with substantial freedom from jitter and drift normally resulting from voltage fluctuation in the power supply, from "strays," and from certain adverse characteristics of vacuum tubes. Such normally adverse characteristics of vacuum tubes and amplifier circuits include the following:

(*a*) Non-linearity of multi-element electronic tubes.

(*b*) Drift resulting from ageing of tubes, particularly in a "direct current" amplifier.

(*c*) Drift resulting from the effect of changed geometry of tube elements on the electrical characteristics of electronic tubes, as heater current or ambient temperature change.

(*d*) Drift resulting from variable "contact-potentials" at the junctions of dissimilar metals, as temperature changes within an electronic tube.

(*e*) Jitter and drift resulting by induction from changes in heater-cathode electric potential difference, as heater current, heater voltage, or heater resistance change.

(*f*) Jitter and drift resulting from variation in the plate resistance of a self-biased electronic tube as plate voltage changes, and with particular reference to conversion to push-pull amplification.

(*g*) Jitter resulting, in an unbalanced amplifier, from the effect of "strays."

(*h*) Jitter and drift, in a normal electronic amplifier, resulting from changes in plate voltage supply, where the basic amplifier stage fails to include voltage regulation as an inherent characteristic integral within the stage and capable of stable cascading within a plurality of stages.

(*i*) Erratic drift resulting from "hot spots" on the cathodes of component electronic tubes.

Another object of my invention is to provide means, in a basic stage of push-pull-differential electronic amplification, capable of effecting stable, linear, high-gain amplification of variable voltages or currents, over a broad band of frequencies including zero cycles per second, at low noise level, inherently adapted to half-wave (single-sided) or to full-wave excitation, further inherently adapted to accept, convert to push-pull, integrate and amplify two related or unrelated half-wave input signals, with substantial freedom from jitter and drift normally resulting from voltage fluctuation of the power supply or from the effect of "strays" or from the adverse characteristics of vacuum tubes.

Another object of my invention is to provide means, in, and in combination with, a basic stage of push-pull-differential electronic amplification, capable of effecting substantial cancellation of that component of jitter and drift resulting by induction from changes in heater-cathode electric potential difference as heater current, heater voltage, or heater resistance of component vacuum tubes change.

Still another object of my invention is to provide means, in a cascaded push-pull-differential electronic amplifier, capable of effecting stable, linear, high-gain amplification of variable voltages or currents, over a broad band of frequencies including zero cycles per second, at low noise level, inherently adapted to half-wave (single-sided) or to full-wave excitation, with substantial freedom from jitter and drift normally resulting from voltage fluctuation of the power supply or from the effect of "strays" or from the adverse characteristics of vacuum tubes.

A further object of my invention is to provide means, in, and in combination with, a cascaded push-pull-differential electronic amplifier, capable of effecting a "Class A" "match" of the differential output of a preceding stage to the input of the stage by which actuated, and further capable of effecting cascaded voltage regulation integral within the cascaded push-pull-differential amplifier.

Other and further objects of my invention will be understood from the specification hereinafter following by reference to the accompanying drawings in which:

Figure 1 shows a means for amplifying electric voltage or current in a cascaded push-pull-differential amplifier, including typical stages together with essential means for cascading voltage regulation integral within the amplifier and for maintaining stable voltage relations between stages.

Figure 2 shows means for combining pentodes with triode followers in typical stages of cascaded push-pull-differential electronic amplification.

Figure 3, in combination with either Figure 1 or Figure 2, shows means for cancellation of that component of jitter resulting by induction from changes in heater-cathode potential difference of component tubes in a push-pull-differential electronic amplifier.

My invention is best described by explanation of typical electronic circuits set forth below. In these descriptions I do not limit my invention to the specific circuits, electronic tubes or applications shown. I do, rather, consider my invention as a broad application of the general principles and circuits described, and as capable of operation with various combinations of presently available circuit elements and electronic tubes.

A typical cascade of push-pull-differential electronic amplification is shown in Figure 1, where reference characters 1 and 2, 5 and 6 indicate respectively "input" electronic tubes of the first and second amplifier stages together with conventional means for providing and controlling electron emission, reference characters 3 and 4, 7 and 8, similarly indicate "differential follower" electronic tubes of the first and second amplifier stages together with means for providing and controlling electron emission, reference characters 9 and 10 represent "matching element" electronic tubes of a typical stage together with means for providing and controlling electron emission, circuit elements 11 and 12 respectively indicate suitable control of grid bias voltage of the input tubes of the first and second stages, circuit elements 15 and 16, 17 and 18 respectively indicate suitable means for control of grid-cathode voltage of the differential followers of the first and second stages, circuit elements 13 and 14 respectively indicate suitable means for balancing the first and second stages, circuit elements 20 and 21 indicate suitable means for impressing a signal voltage or current on the input tubes of the first stage, circuit elements 22 and 23 represent the "differential load impedance" of the first stage and indicate a suitable means for impressing the output of the first stage on the input of the second stage, circuit elements 24 and 25 represent the "differential load impedance" of the second stage and indicate a suitable means for utilizing the output of the cascaded amplifier, circuit element 19 indicates suitable means for design adjustment of plate voltage supply of the first stage, circuit point G indicates ground potential and the negative terminal of the plate voltage power supply, circuit character $E_1$ represents the electric potential difference above G at circuit point $E_1$, circuit character E represents the electric potential difference above G at circuit point E and constitutes the positive terminal of the plate voltage power supply, circuit characters $A_1$, and $A_2$ represent amplifier input terminals, circuit character $M_1$ indicates the mid-point of the first stage differential load impedance, and circuit character M indicates the mid-point of the second stage differential load impedance.

A typical cascade of push-pull-differential amplification, combining pentode input tubes with triode followers is shown in Figure 2, where reference characters 1 through 25 also $A_1$, $A_2$, G, $E_1$, E, $M_1$ and M perform the same functions as described for Figure 1, and, additionally, circuit characters 26 and 27 respectively indicate suitable means for design adjustment of screen-grid voltage of the input tubes of the first and second stages.

Figure 3, when combined with either Figure 1 or Figure 2, shows a means for cancelling that component of drift or jitter resulting from changes in heater-cathode potential difference, where circuit characters $H_1$, $H_2$, $H_3$, $H_4$, $H_5$, $H_6$, $H_7$, $H_8$, $H_9$ and $H_{10}$ represent the heater elements of vacuum tubes 1 through 10 inclusive, where circuit elements 28 and 29 represent means for minimizing heater-cathode potential difference, circuit element 30 indicates suitable means for adjusting heater current, and where suitable heater power supply is indicated.

With the foregoing in mind, I have observed, and it will be obvious to those versed in the art, that the following conditions exist, and the following sequence of events occurs, in the typical circuit of Fig. 1:

(*a*) First let it particularly be noted that the differential load impedance of the first stage is mutual to the plate circuits of both input tubes and to the plate circuits of both differential follower tubes of the first stage, and further that the normal potential of its mid-point, $M_1$, is established by conditions integral within the stage and is not restrained by any external connection. Let a suitable plate voltage $E_1$ be impressed across the first stage between points G and $E_1$ and let the stage be balanced by adjustment of the balancing potentiometer, 13, so that the plate currents of all first stage tubes are mutually equal, and so that no current flows through the first stage differential load impedance. The input tubes, acting in parallel, will then control the differential follower tubes, also acting in parallel, as a voltage regulator, maintaining a condition of zero current through the differential load impedance and tending to maintain a constant potential at the cathodes of the differential follower tubes as the plate voltage supply $E_1$, of the first stage varies within reasonable limits. Similarly, with the amplifier connected for full-wave excitation and within the capabilities of its component tubes, neither "strays" nor small variations in the mid-point potential of the input signal will cause differential current to flow through the differential load impedance.

(*b*) Let it next particularly be noted that the second stage, which constitutes a typical stage, is similar to the first stage with respect to its action as a voltage regulator and additionally incorporates a "matching element." The "matching element" is composed of one or more vacuum tubes connected in parallel and performs two vital functions. It is correctly phased; (1) to establish and maintain the grid-cathode potential of the second stage input tubes in correct adjustment for "Class A" amplification as excited by the differential output of the first stage, and (2) to force the first stage to sense and to respond to any change in voltage of the power supply and to act as an exciter in ultimate control of the differential follower tubes of the second (or any final) stage as voltage regulators in a cascade of voltage regulation integral within the amplifier.

(*c*) The art recognizes the linearity and inherent low noise level of differential amplification.

(*d*) With the amplifier in operation and balanced, let an input signal be impressed, in full-wave excitation, and consider that instant at which the exciting voltage at terminal $A_1$ is positive and equal in magnitude to the negative exciting voltage at terminal $A_2$. In comparison with circuit values existing for zero signal, the plate current of input tube 1 will increase and its plate voltage will decrease, the plate current of input tube 2 will decrease by an increment equal in magnitude to the increment of plate current occurring in tube 1 and the plate voltage of tube 2 will increase. The plate currents of input tubes 1 and 2, passing respectively through circuit elements 15 and 16 will make the grid-cathode voltages of differential follower tube 3 more negative and of differential follower tube 4 less negative. The plate current of tube 3 will decrease and the plate voltage of tube 3 will increase. The plate current of tube 4 will increase and the plate voltage of tube 4 will decrease. Differential current will flow from the cathode of tube 4 through the differential load impedance 23—22 to the cathode of tube 3. The voltage drop caused by the differential current flowing through the first stage differential load impedance constitutes an amplified voltage, linearly related to and in phase with the exciting signal, and mutual to the input of the second stage where similar action occurs resulting in further amplification and availability at the terminals of the second stage differential load impedance for application as desired.

(*e*) With the first stage in operation and balanced, let a half-wave (single-sided) exciting signal be impressed between terminals $A_1$ and G, and consider that instant at which the exciting voltage at $A_1$ is positive to the potential at G. In comparison with circuit values existing for zero excitation, the grid of input tube 2 remains at G potential, the plate current of input tube 1 increases, the plate voltage of tube 1 decreases, the grid-cathode voltage of differential follower tube 3 becomes more negative, the plate current of tube 3 decreases, the plate voltage of tube 3 increases, and the potential at the cathode of tube 3 becomes less positive causing differential current to flow through the differential load impedance 23—22 from the cathode of tube 4 toward the cathode of tube 3 meeting the increased plate current demand of input tube 1. The potential at the cathodes of input tubes 1 and 2 tends to become more positive with respect to circuit point G, hence to the grid of input tube 2, causing the plate current of tube 2 to decrease and effecting a partial conversion to push-pull relations. The increased plate current demand on differential follower tube 4 increases the voltage drop through the "plate resistance" of tube 4, lowering the potential at the cathode of tube 4 hence decreasing the plate voltage of input tube 2. The circuit now comes to balance with the negative increment of plate current in tube 2 substantially equal in magnitude to the positive increment of plate current in tube 1, with the potential at the cathodes of input tubes 1 and 2 tending to become more positive and with the potential at the mid-point of the differential load impedance tending to become less positive. A differential voltage is thus developed in the differential load impedance, linearly related to and in phase with the impressed signal, and symmetrically proportioned in full-wave relations with respect to the mid-point of the differential load impedance of the first stage and available as excitation for further cascaded amplification. It should here be noted that to effect the above stable conversion of single sided excitation to full-wave (push-pull) relations as an integral function of a push-pull-differential amplifier stage requires that the mid-point potential of the differential load impedance be established freely by conditions integral within the circuit and that it be not otherwise restrained. Following similar analysis it follows that two related or unrelated half-wave exciting signals impressed respectively across $A_1$ and G and $A_2$ and G will be converted to full-wave relations, integrated and amplified in a typical stage of push-pull-differential amplification.

(*f*) If, in a differential, or push-pull-differential amplifier, heater current be held constant by substantial voltage regulation of direct current supplying a group of heaters connected in series, heater temperature, hence tube geometry and "contact potentials," become constant after balance has been reached with ambient temperature. And if, under the above conditions, a stage of amplification is first "balanced" to obtain zero output, and an alternating current component is then impressed in series with the heater circuit, heater temperature, tube geometry and "contact potentials" will remain constant, but heater-cathode potential differences, transferred by induction as components of the amplifier conditions and included in the compensation of the original balance, will vary and will result in both jitter and drift seriously limiting the useable voltage gain of the amplifier. The heater connections indicated in Fig. 3, however, ensure that variations in heater-cathode potentials will be impressed equally on both sides of the symmetrical amplifier array and that drift and jitter from this source will substantially be cancelled.

(*g*) Where pentodes are employed as input tubes in combination with triode differential followers, more favorable means are available to "balance" the amplifier in compensation for variation in the geometry of component tubes, as indicated by circuit elements 13 and 14. Higher gain per stage also is available since the plate current of a pentode is substantially independent of plate voltage, thus permitting the plate load impedance of the differential follower tubes to be concentrated for maximum usefulness in the differential load impedance. Screen grid current of the first stage input tubes may be derived directly from the differential follower tubes as shown, or it may be derived from a "matching element" tube incorporated in the first stage. Under either condition the amplifier responds to full-wave excitation as described in (*d*) above. It also converts half-wave excitation to full-wave relations through the effect of screen grid voltage on tube transconductance, as controlled by the voltage at circuit point $M_1$, in a manner similar to that described for triodes in (*e*) above.

(*h*) Avoidance of gaseous voltage regulators is desirable in a direct current amplifier. However, it is noted that circuit element 12 of the typical stage may appropriately incorporate gaseous voltage regulator tubes where design requirements demand a rigorously fixed reference voltage.

(*i*) It is to be noted that circuit element 12 of the typical stage functions, through the agency of favorable degeneration, to impose full-wave relations within its stage, thus correcting any distortion that may be present, and that it does this with no impairment of amplifier differential voltage gain.

The invention described herein may be manufactured and used by or for the Government of the United States of America for governmental purposes without the payment of any royalties thereon or therefor.

I claim as my invention:

1. A push-pull differential electronic amplifier stage comprising; first and second input pentode amplifier tubes, each having a cathode, control grid, screen grid and anode; third and fourth tubes, each having a cathode, control grid and anode and connected as differential follower triodes for said first and second tubes; a stage input circuit including an impedance connected at the respective ends thereof to said pentode control grids and at the mid-point to ground; an element joining the cathodes of the first and second tubes and connecting said junction to ground, said element constituting a direct current voltage dropping device responsive to current therein; a resistance element series connected from the anode of each pentode to the cathode of the triode connected thereto, the respective circuits from said ground to said triode cathodes forming first and second arms of a bridge circuit; means supplying positive potential through a common junction to the plates of said triode followers, respectively, the respective circuits from said common junction to the cathodes of the triodes forming third and fourth arms of said bridge; means varying conductance of said third and fourth arms inversely as the currents in the associated pentode anodes, comprising a connection from each said pentode anode to the control grid of the associated triode; an output differential load element connected between the cathodes of the triodes and constituting part of the output current paths of triodes and pentodes of the bridge, said differential element having a mid-point potential reference; and a potentiometer connected at the ends thereof to the respective screen grids, the variable arm thereof being connected to said midpoint potential reference for effecting energization of the screen grids responsively to the reference potential and whereby the bridge is adjusted to balance at no input signal and the triodes are additionally controlled as regulators to provide substantially constant voltage above ground at said reference mid-point.

2. An electronic amplifier bridge comprising; a plurality of vacuum tubes each including at least a cathode, an anode and a control grid, a first and a second of said tubes having said control grids thereof connected, respectively, to opposite ends of a centrally grounded input impedance for oppositely varying the impedance of the current paths in said first and second tubes; a resistance element connecting the amplifier ground to the cathodes of said first and second tubes; a resistance connected between the anode of the first tube and cathode of a third tube, said resistance element, said first tube and said resistance forming the first arm of said bridge; a resistance connected between the anode of the second tube and the cathode of a fourth tube, thereby forming with said resistance element and said second tube the second arm of said bridge; means including a common junction connecting the anodes of the third and fourth tubes to a source of positive potential; a differential load impedance connected between the cathodes of the third and fourth tubes and forming the output diagonal of said bridge, said ground and common junction being, respectively, at the opposite ends of the other diagonal; and means including connections from the anodes of the first and second tubes, respectively, to the control grids of the third and fourth tubes for varying the impedance of the third and fourth arms of the bridge inversely as the currents in said first and second arm, whereby each arm of the bridge contributes to linear differential amplification of input voltage, said amplified voltage being impressed across said differential load impedance.

3. A push-pull differential amplifier stage adapted for cascading with a preceding similar stage comprising; first and second pentode amplifier tubes connected together at the cathodes thereof and thence to ground through a common biasing resistor, the control grids thereof being respectively connected to opposite ends of a center-grounded input impedance; first and second triode amplifier tubes arranged in differential following relationship to said pentodes, the cathodes thereof being connected together through a stage differential output impedance, the anodes thereof being connected to a source of positive voltage, the grids thereof being respectively connected directly to the anodes of said pentodes, and the cathodes thereof being respectively connected through triode bias resistors to the anodes of the pentodes; potentiometer means connecting the electrical center of said differential output impedance to the screen grids of the pentodes, said means including adjustment for equalizing the anode currents in the pentodes when no voltage is impressed across said input impedance; and means within said stage for cascading the stage with a preceding similar stage including at least one amplifier tube connected at the anode thereof to said source of positive voltage and at the grid thereof to said electrical center, the cathode being connected to a resistance for supplying regulated positive voltage to said preceding stage independently of signal voltage and positive voltage supply variations.

4. The amplifier stage of claim 3 wherein said potentiometer means connects to said electrical center through the cathode to grid path in said tube within the cascading means, said cascading means and said potentiometer being responsive to the voltage at said electrical center and controlling said triodes as voltage regulators independently of signal.

5. An amplifier bridge network of pentode input tubes and triode differential followers, comprising; first and second pentode amplifier tubes having the cathodes thereof joined and connected to ground through a common resistance, the grids connected to opposite ends of an input impedance connected therebetween and center-tapped to ground, the anodes thereof being respectively connected through resistance elements to opposite ends of the cross diagonal of the major bridge of said network, said common resistor, the conductance path of the first pentode and the associated said resistance element forming the first arm of the major bridge, said common resistor, the conductance path of the second pentode and the remaining said resistance element forming the second arm of the major bridge; a pair of triode amplifier tubes connected with the cathodes respectively at the ends of said cross diagonal and the anodes joined at a positive voltage supply point, the conductance paths of the triodes forming the third and fourth arms, respectively, of the major bridge; a differential load impedance element connected along said cross diagonal to the cathodes of said triodes; means including connections from the grids of said triodes to the anodes of the first and second pentodes, respectively, for varying the conductance of the third and fourth arms of the bridge inversely as the conductance of the first and second arms, in response to signal impressed on said input impedance; third and fourth arms of a secondary bridge of said network comprising, respectively, resistive connections from the mid-point of said differential load impedance to the screen grids of the first and second pentodes, the first and second arms of the seconary bridge comprising the cathode-to-screen grid paths in the first and second pentodes; and means including variable portions of said third and fourth arm resistive connections for balancing the currents in the respective arms of the bridge when no signal is present in the input impedance.

6. The bridge network of claim 5 adapted for cascaded amplification with a prior similar network, wherein said third and fourth arms of the secondary bridge include the cathode-to-grid circuit of a triode having the grid thereof connected to said midpoint and the anode to said positive voltage supply point, said third and fourth major bridge arm triodes being controlled as voltage regulators independent of signal.

7. A push-pull differential electronic amplifier of at least two similar cascaded stages each comprising a plurality of vacuum tubes having at least a cathode, control grid and plate, an input circuit including the grids of first and second input tubes, a resistance element grounded at one end thereof and connected at the other end thereof to the cathodes of said first and second tubes, a circuit containing an impedance element common to the output of said first tube and the input to a third tube, a circuit containing an impedance element common to the output of said second tube and the input of a fourth tube, means balancing the currents in said third and fourth tubes when said input circuit is quiescent, a stage output differential load element connected between the cathodes of the third and fourth tubes and common to the output circuits of said first, second, third and fourth tubes, said impedance elements and said load element being series connected between the plates of the first and second tubes, and at least one matching element tube in each instant stage, except the first, each said matching element tube having the plate thereof connected to a source of positive plate potential, the cathode thereof connected to the plates of the third and fourth tubes of the preceding cascaded stage, and the grid thereof at the potential of the midpoint of said differential load element of said individual stage, whereby said matching element tubes act as voltage regulators for said individual stages.

8. A push-pull-differential electronic amplifier stage comprising a plurality of vacuum tubes, a first and second of said tubes being input pentodes connected in push-pull relation, a third and fourth of said tubes being triodes in differential following relation to said pentodes, an input circuit connected to at least the first of said tubes, a resistance connected from ground to the cathodes of said first and second tubes, a circuit containing a resistance element common to the output of said first tube and the input of said third tube, a circuit containing a resistance element common to the output of said second tube and the input of said fourth tube, a differential load impedance element common to the output circuits of said first, second, third and fourth tubes, said differential load impedance element being connected between the cathodes of said third and fourth tubes, a fifth tube having a control grid connected to the mid-point of said load element, a circuit connecting the plate of said fifth tube to a positive power supply, and a circuit containing a balancing element connected between the cathode of said fifth tube and the screen-grids of said pentode tubes for equalizing the pentode plate currents when said input circuit is not energized, the plates of the third and fourth triodes being connected to a positive voltage source.

9. A push-pull differential electronic amplifier stage for use in cascade with similar stages comprising a plurality of vacuum tubes, an input circuit connected to the control grid of a first tube, said tube being a pentode amplifier, a second pentode tube connected in push-pull relationship with the first said pentode tube, a resistance connected from ground to the cathodes of said first and second tubes, a circuit containing a resistance element common to the output of said first tube and the input of a third tube, a circuit containing a resistance element common to the output of said second tube and the input of a fourth tube, a differential load impedance element common to the outputs of said first, second, third and fourth tubes, a fifth tube having a control grid thereof connected to the mid-point of said load element and an anode connected to the positive terminal of the plate voltage power supply, a voltage dropping resistor connected to the cathode of said fifth tube and in series therewith and adapted to provide a controlled secondary voltage supply for a preceding cascaded amplifier stage said secondary supply voltage being substantially independent of the current variations in said first, second, third and fourth tubes, and a balancing element connecting the screen grids of said pentode tubes for equalizing the pentode plate currents when said input circuit is not energized, said balancing element and said fifth tube effecting control of said triodes as voltage regulators independently of signal in said amplifier stage.

JOHN E. WILLIAMS.

REFERENCES CITED

The following references are of record in the file of this patent:

UNITED STATES PATENTS

| Number | Name | Date |
|---|---|---|
| 2,310 342 | Artzt | Feb. 9, 1943 |
| 2 329,073 | Mitchell et al. | Sept. 7, 1943 |
| 2,424,893 | Mansford | July 29, 1947 |
| 2,428,295 | Scantlebury | Sept. 30, 1947 |

OTHER REFERENCES

"Electronics," August 1945, Survey of D. C. Amplifiers, by Maurice Artzt, reprint in Division 69, (179—171.1A)